(12) United States Patent
Yamada

(10) Patent No.: US 8,507,994 B2
(45) Date of Patent: Aug. 13, 2013

(54) SEMICONDUCTOR DEVICE

(75) Inventor: Kouichi Yamada, Gifu (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 32 days.

(21) Appl. No.: 13/205,314

(22) Filed: Aug. 8, 2011

(65) Prior Publication Data

US 2012/0043615 A1 Feb. 23, 2012

(30) Foreign Application Priority Data

Aug. 17, 2010 (JP) ................ 2010-182162

(51) Int. Cl.
*H01L 27/10* (2006.01)
(52) U.S. Cl.
USPC ........... 257/377; 257/208; 257/367; 257/369; 257/E21.616; 257/E27.062; 365/156; 365/157
(58) Field of Classification Search
USPC .................. 257/208, 367, 369, 377, E21.616, 257/E27.062; 365/156, 157
See application file for complete search history.

(56) References Cited

U.S. PATENT DOCUMENTS

| 6,100,568 | A | * | 8/2000 | Lage | 257/392 |
| 7,075,157 | B2 | * | 7/2006 | Kikushima et al. | 257/377 |
| 7,511,989 | B2 | * | 3/2009 | Thomas et al. | 365/154 |
| 8,013,399 | B2 | * | 9/2011 | Thomas et al. | 257/393 |
| 2005/0179061 | A1 | * | 8/2005 | Jang et al. | 257/208 |

FOREIGN PATENT DOCUMENTS

JP 4190242 12/2008

* cited by examiner

*Primary Examiner* — Dao H Nguyen
(74) *Attorney, Agent, or Firm* — Morrison & Foerster LLP

(57) ABSTRACT

In a memory cell including CMOS inverters, an increase in an area of the memory cell caused by restrictions on a gate wiring due to a leakage current and restrictions due to design rules is suppressed. A first wiring and a second wiring are laid out as a first metal layer in the memory cell that includes a first inverter and a second inverter. The first wiring is connected with two drains in the first inverter and a second gate wiring in the second inverter. The second wiring is connected with two drains in the second inverter and a first gate wiring in the first inverter. The first wiring is laid out to overlap with the second gate wiring, and the second wiring is laid out to overlap with the first gate wiring. A second metal layer is laid out above the first metal layer, and a third metal layer is laid out above the second metal layer.

7 Claims, 6 Drawing Sheets

SEMICONDUCTOR DEVICE

CROSS-REFERENCE OF THE INVENTION

This application claims priority from Japanese Patent Application No. 2010-182162, the content of which is incorporated herein by reference in its entirety.

BACKGROUND OF THE INVENTION

1. Field of the Invention

This invention relates to a semiconductor device, specifically to a layout of a semiconductor device provided with a memory cell that includes CMOS inverters.

2. Description of the Related Art

In recent years, many computer systems are incorporated in home appliances and machines, which increasingly require electronic control. A memory-embedded semiconductor device in which a memory such as a flash memory, SRAM (Static Random Access Memory) or the like is formed on a single semiconductor substrate (that is, a semiconductor die) together with a microcomputer is known as an example of such a computer system.

In order to reduce a size of the memory-embedded semiconductor device, it is required that an area of the die occupied by the SRAM which is often primarily used as a buffer memory is decreased as much as possible while an area of the die occupied by the flash memory which is required to have a large storage capacity is increased as much as possible.

For example, a memory cell shown in FIG. 1 of Japanese Patent No. 4190242 discloses a layout to minimize an area of an SRAM memory cell that includes two CMOS inverters. In the memory cell, gate wirings of the two CMOS inverters are placed close to each other and a connection between drains of transistors in each of the two inverters and a loop connection between the drains and gates of the two inverters are made using two metal layers that are upper layers of the gate wirings. The area of the memory cell can be minimized with the layout.

In some cases, however, restrictions to be explained below are imposed in forming the SRAM described above, depending on process technologies and design rules adopted. The restrictions would increase the area of the memory cell and increase the size of the memory-embedded semiconductor device in which the SRAM is formed.

For example, in order to optimize manufacturing of the flash memory that occupies a large area, process technologies (process technologies for the flash memory, for example) that are not best suitable for manufacturing the SRAM are adopted in some cases. Since the design rules are restricted due to conditions of the process technologies and a leakage current is apt to be caused between a source and a drain depending on a width of the gate wiring that constitutes the CMOS inverter in the SRAM, using a layout that requires increased width of the gate wiring (that is, gate length) is necessary to suppress the leakage current.

Also, there are cases in which flexibility in designing a wiring pattern in an uppermost metal layer is severely restricted, depending on design rules applied to metal layers used in multi-layer wirings. For example, when the design rules impose a restriction that a thick external connection electrode such as a bonding pad is to be formed of the uppermost metal layer, fine wiring pattern is not available with the uppermost metal layer.

To explain the restrictions in the design rules in the case where they are applied to the memory cell of the SRAM shown in FIG. 1 of Japanese Patent No. 4190242, a bit line has to be laid out in a second metal layer that allows fine wiring pattern although it should be otherwise laid out in the uppermost metal layer that is a third metal layer. The wiring connecting between the drains of transistors in each of the two CMOS inverters is also laid out in the second metal layer, and has to be laid out largely detoured to avoid the bit line in the same metal layer. Therefore, the layout of the second metal layer is largely expanded to increase the area of the memory cell.

This invention is directed to offer a semiconductor device that can suppress the increase in the area of the memory cell even though there are restrictions on the gate wiring due to the leakage current between the source and the drain of the transistor in the CMOS inverter constituting the SRAM or the restrictions in the design rules imposed on the metal layers used in the multi-layer wiring.

SUMMARY OF THE INVENTION

The invention provides a memory cell configured to operate as part of a semiconductor device. The memory includes a first CMOS inverter having a first transistor of a P channel and a second transistor of an N channel, a second CMOS inverter having a third transistor of a P channel and a fourth transistor of an N channel, a first gate wiring connecting a gate of the first transistor and a gate of the second transistor, a second gate wiring connecting a gate of the third transistor and a gate of the fourth transistor and a first metal layer disposed on the first and second gate wirings and including a first wiring portion and a second wiring portion. The first wiring portion is connected to a drain of the first transistor, a drain of the second transistor and the second gate wiring. The second wiring portion is connected to a drain of the third transistor, a drain of the fourth transistor and the first gate wiring. The first wiring portion overlaps the second gate wiring at least partially. The second wiring portion overlaps the first gate wiring at least partially. The memory cell also includes a second metal layer disposed on the first metal layer, and a third metal layer disposed on the second metal layer.

DETAILED DESCRIPTION OF THE INVENTION

Figure 1:
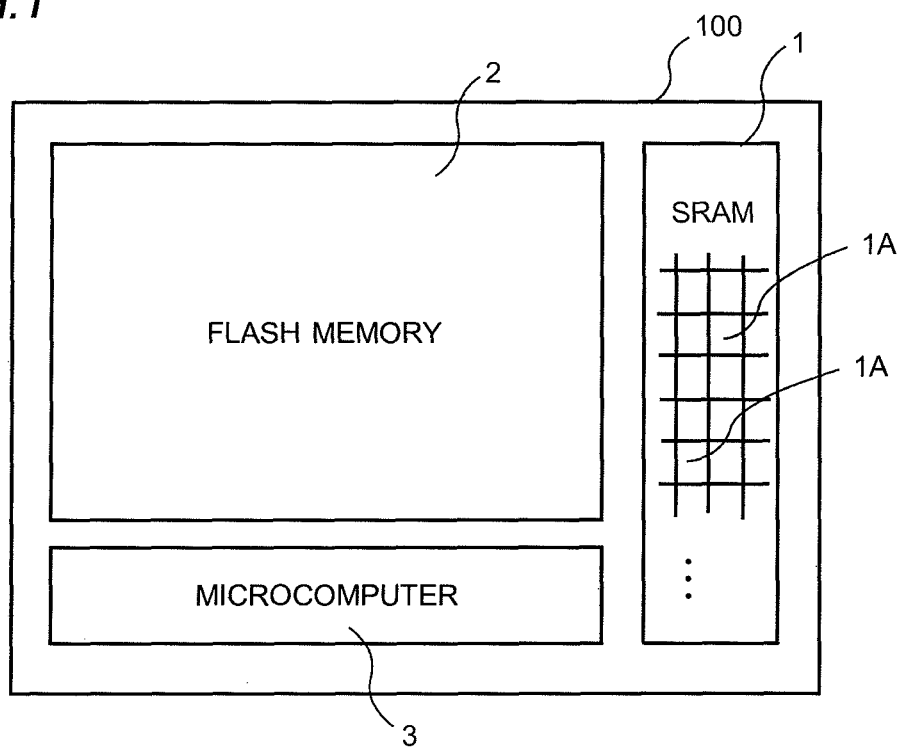
FIG. 1 is a plan view showing an outline structure of a semiconductor device according to an embodiment of this invention.

A semiconductor device according to an embodiment of this invention will be described referring to the drawings. FIG. 1 is a plan view showing an outline structure of the semiconductor device. A static type semiconductor memory (hereafter referred to as an SRAM 1) made of a regular array of a plurality of memory cells 1A is disposed on a semiconductor substrate 100, as shown in FIG. 1. Also, a flash memory 2 and a microcomputer 3 that controls the SRAM 1 and the flash memory 2 are disposed on the semiconductor substrate 100. They form a memory-embedded semiconductor device, which is a single semiconductor chip.

The flash memory 2 serves as a large storage capacity (4 M bytes, for example) memory compared with the SRAM 1 that serves as a small storage capacity (256 K bytes, for example) buffer memory. In this case, a ratio of an area occupied by the flash memory 2 to a total area of the semiconductor substrate 100 (about 90%, for example) is significantly larger than a ratio of an area occupied by the SRAM 1.

Figure 2:
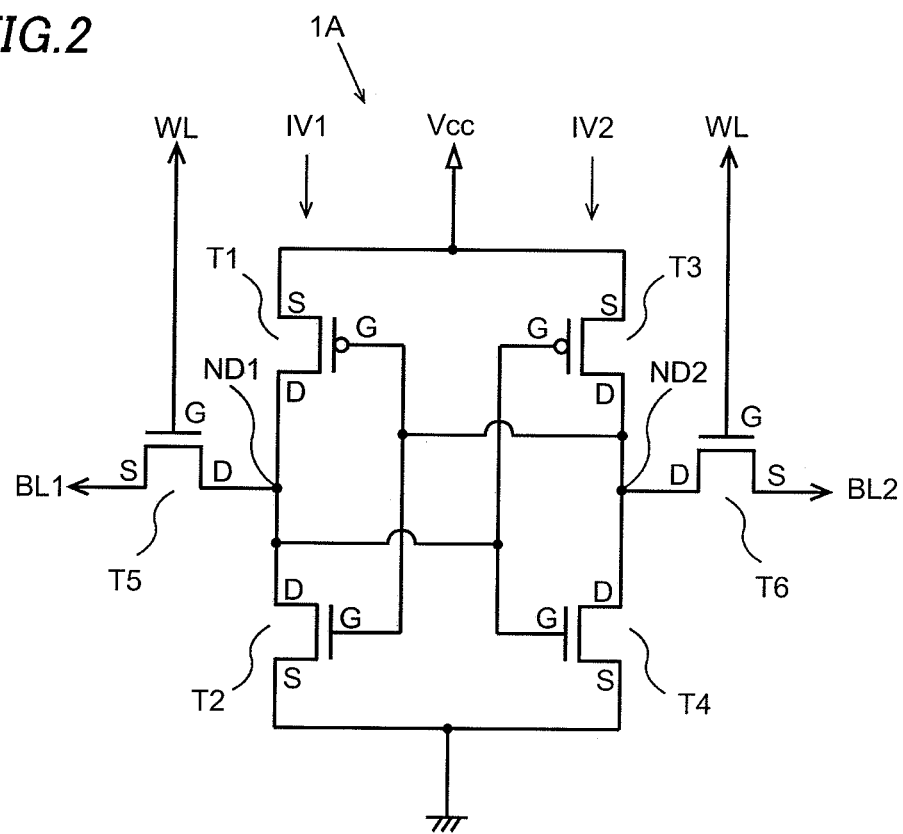
FIG. 2 is an equivalent circuit diagram showing a memory cell of an SRAM shown in FIG. 1.

An equivalent circuit of the memory cell 1A included in the SRAM 1 is hereafter explained. FIG. 2 is an equivalent circuit diagram showing a single memory cell 1A out of the plurality of memory cells 1A included in the SRAM 1.

As shown in FIG. 2, the memory cell 1A includes a first inverter IV1 and a second inverter IV2 that are CMOS inverters and two transfer gates T5 and T6 that are made of N channel transistors. The first inverter IV1 is composed of a P channel transistor T1 and an N channel transistor T2, and the second inverter IV2 is composed of a P channel transistor T3 and an N channel transistor T4.

The first inverter IV1 and the second inverter IV2 are connected between a power supply Vcc and a ground, and are always provided with the power supply Vcc. The inverters IV1 and IV2 are connected to each other to form a loop connection, and connecting nodes ND1 and ND2 retain stored data that are reverse to each other in a logic level.

An example layout of the memory cell 1A on the semiconductor substrate 100 is described below. Each of FIGS. 3 through 6 is a plan view showing different layers in the layout of the memory cell 1A.

Figure 3:
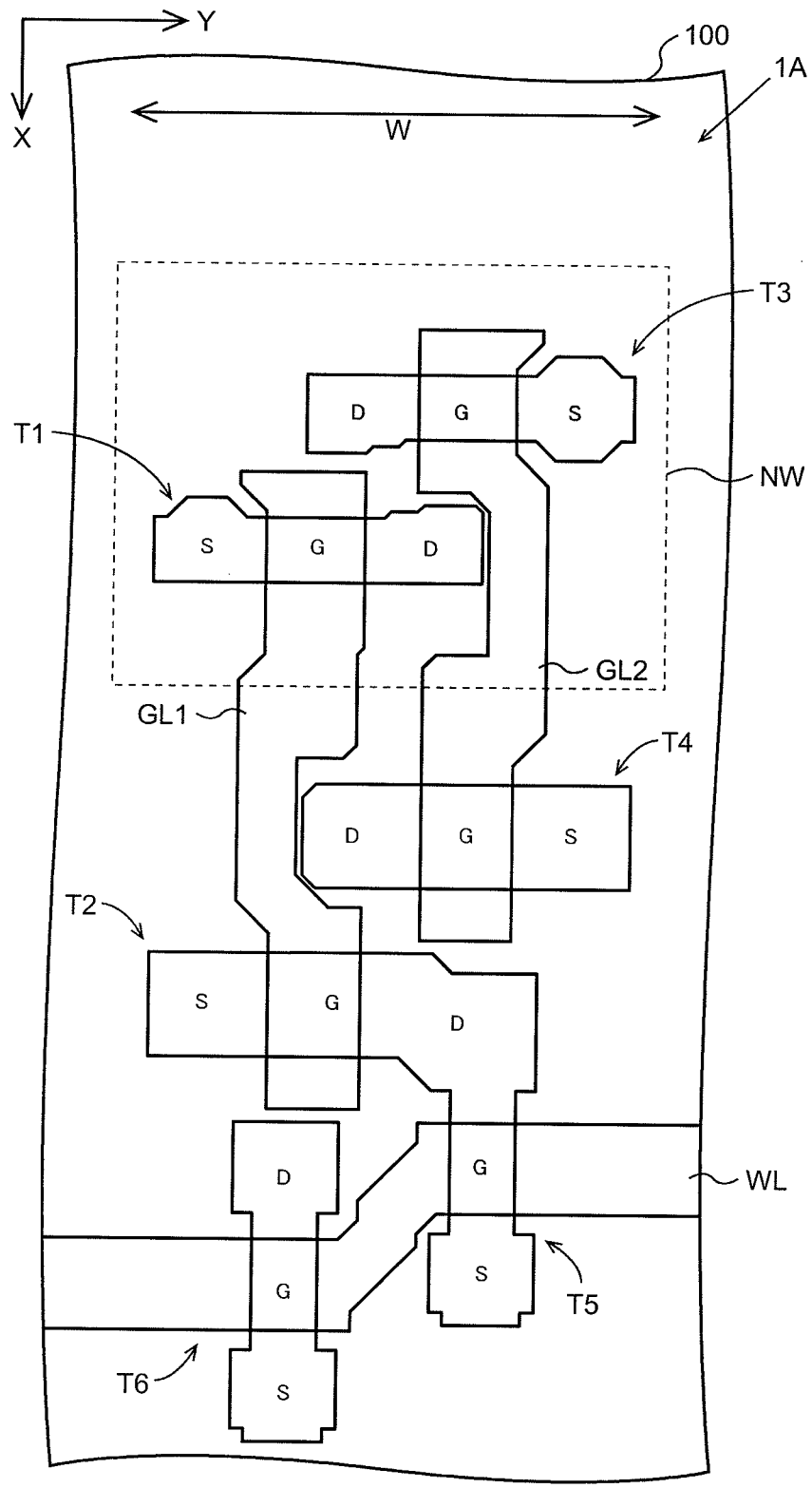
FIG. 3 is a plan view showing a layout of the memory cell of the SRAM shown in FIG. 1.

FIG. 3 shows a layout of the P channel transistors T1 and T3 and the N channel transistors T2 and T4 formed on the semiconductor substrate 100. For example, the P channel transistors T1 and T3 in the first and second inverters IV1 and IV2 are disposed in an N type well NW disposed in the semiconductor substrate 100. Each of the P channel transistors T1 and T3 has a drain D and a source S that are laid out as a P type active layer. The N channel transistors T2 and T4 in the first and second inverters IV1 and IV2 are disposed in an area of the P type semiconductor substrate 100. Each of the N channel transistors T2 and T4 has a drain D and a source S that are laid out as an N type active layer.

A gate G of the P channel transistor T1 and a gate G of the N channel transistor T2, which constitute the first inverter IV1, are continuously formed as a first gate wiring GL1 that is made of polysilicon. A center line of the first gate wiring GL1 extends approximately along an X direction shown in FIG. 3.

Similarly, a gate G of the P channel transistor T3 and a gate G of the N channel transistor T4, which constitute the second inverter IV2, are continuously formed as a second gate wiring GL2 that is made of polysilicon. A center line of the second gate wiring GL2 also extends approximately along the X direction shown in FIG. 3.

In addition, a gate G of the transfer gate T5 and a gate G of the transfer gate T6 are continuously formed as a word line WL that is made of polysilicon. A center line of the word line WL extends approximately along a Y direction that orthogonally intersects the X direction as shown in FIG. 3.

The first inverter IV1 and the second inverter IV2 are disposed as close as possible by laying out as described below.

The drain D of the P channel transistor T1 of the first inverter IV1 is laid out so as to overlap with a line connecting between the drain D of the P channel transistor T3 and the drain D of the N channel transistor T4 of the second inverter IV2 and to extend toward the channel beyond a line connecting between a channel side edge of the drain D of the P channel transistor T3 and a channel side edge of the drain D of the N channel transistor T4. The second gate wiring GL2 is laid out being partially bent so that it is separated from the drain D of the P channel transistor T1. Furthermore, it is preferable that the drain D of the P channel transistor T3 is laid out so as to overlap with an extension of the center line of the first gate wiring GL1.

On the other hand, the drain D of the N channel transistor T4 of the second inverter IV2 is laid out so as to overlap with a line connecting between the drain D of the P channel transistor T1 and the drain D of the N channel transistor T2 of the first inverter IV1 and to extend toward the channel beyond a line connecting a channel side edge of the drain D of the P channel transistor T1 and a channel side edge of the drain D of the N channel transistor T2. The first gate wiring GL1 is laid out being partially bent so that it is separated from the drain D of the N channel transistor T4.

With the layout described above, the first inverter IV1 and the second inverter IV2 can be disposed as close as possible to each other since the first gate wiring GL1 and the second gate wiring GL2 can be disposed as close as possible to each other.

Figure 4:
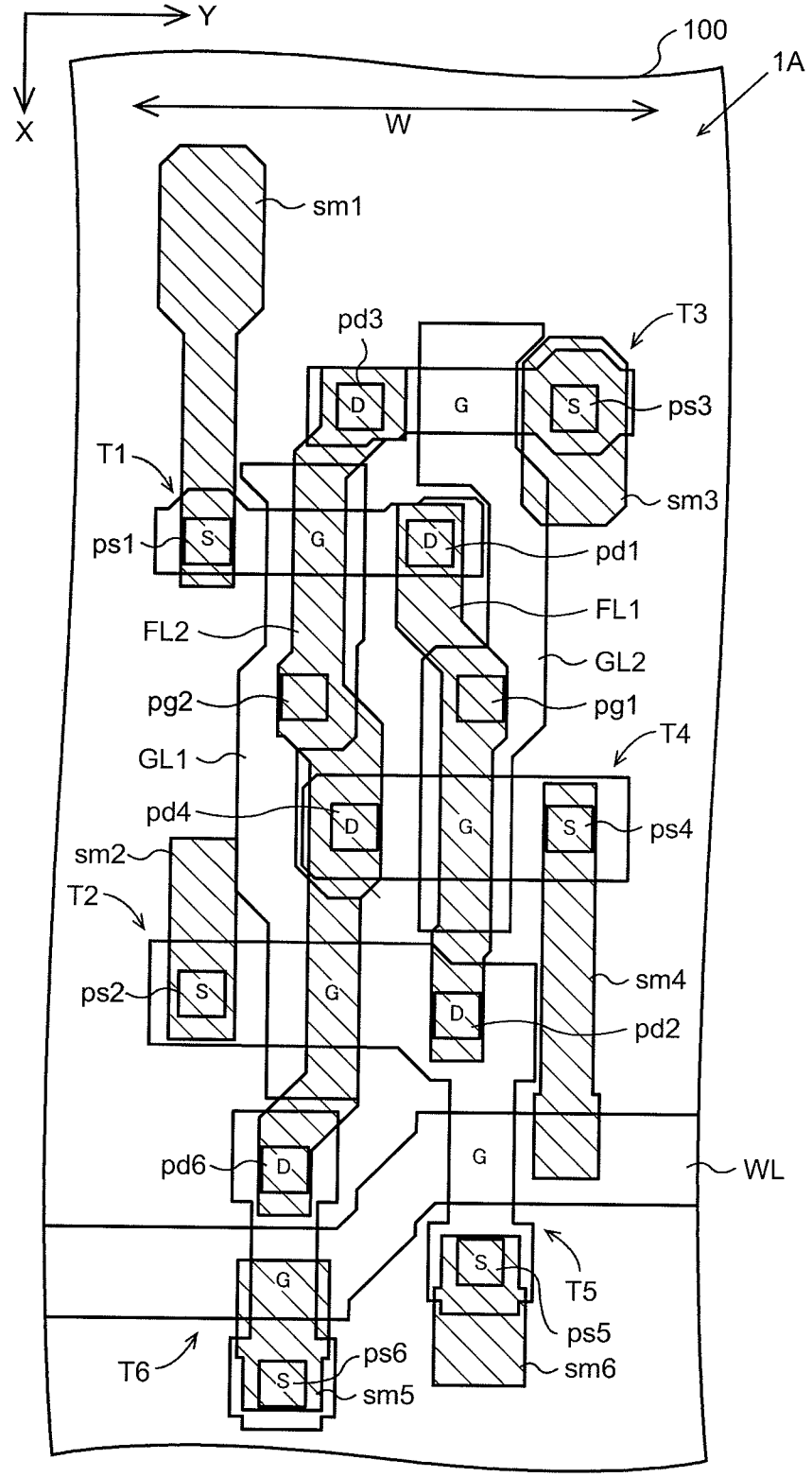
FIG. 4 is a plan view showing a layout of the memory cell of the SRAM shown in FIG. 1.

A layout of a first metal layer that is an upper layer of the first gate wiring GL1 and the second gate wiring GL2 is hereafter explained. FIG. 4 shows the layout of the first metal layer disposed on an insulation film (not shown) that covers the first gate wiring GL1 and the second gate wiring GL2. The first metal layer is made of aluminum or alloy including aluminum, for example. The first metal layer is shown shaded with dots in FIG. 4.

A first wiring FL1 laid out as the first metal layer is continuously formed and electrically connected with the drain D of the P channel transistor T1 and the drain D of the N channel transistor T2 of the first inverter IV1 as well as being electrically connected with the second gate wiring GL2.

The first wiring FL1 is connected with plugs pd1, pd2 and pg1 each formed in a contact hole penetrating through the insulation film (not shown) on each of the drain D of the P channel transistor T1, the drain D of the N channel transistor T2 and a portion of the second gate wiring GL2, respectively.

A major portion of the first wiring FL1 overlaps with the second gate wiring GL2, and a center line of the first wiring FL1 extends along the same direction as the second gate wiring GL2, that is the X direction shown in FIG. 4. The first wiring FL1 overlaps with the second gate wiring GL2 at least above the gate G of the N channel transistor T4 of the second inverter IV2 and above its vicinity. It is preferable that a width of the first wiring FL1 overlapping with the second gate wiring GL2 is equal to or smaller than a width of the second gate wiring GL2. For example, the width of the second gate wiring GL2 is about 0.4 μm-0.5 μm, while the width of the first wiring FL1 overlapping with the second gate wiring GL2 is about 0.2 μm-0.3 μm.

A second wiring FL2 laid out as the first metal layer is continuously formed and electrically connected with the drain D of the P channel transistor T3 and the drain D of the N channel transistor T4 of the second inverter IV2 as well as being electrically connected with the first gate wiring GL1 and a drain D of the transfer gate T6.

The second wiring FL2 is connected with plugs pd3, pd4, pg2 and pd6 each formed in a contact hole penetrating through the insulation film (not shown) on each of the drain D of the P channel transistor T3, the drain D of the N channel transistor T4, a portion of the first gate wiring GL1 and the drain D of the transfer gate T6, respectively.

A major portion of the second wiring FL2 overlaps with the first gate wiring GL1, and a center line of the second wiring FL2 extends along the same direction as the first gate wiring GL1, that is the X direction shown in FIG. 4. The second wiring FL2 overlaps with the first gate wiring GL1 at least above the gates G of the P channel transistor T1 and the N channel transistor T2 of the first inverter IV1 and above their vicinity. It is preferable that a width of the second wiring FL2 overlapping with the first gate wiring GL1 is equal to or smaller than a width of the first gate wiring GL1. The width of the first gate wiring GL1 is similar to the width of the second gate wiring GL2, and the width of the second wiring FL2 overlapping with the first gate wiring GL1 is similar to the width of the first wiring FL1 overlapping with the second gate wiring GL2.

As described above, electrical connection between the two drains included in each of the first and second inverters IV1 and IV2 and the loop connection between the first inverter IV1 and the second inverter IV2 are implemented only with the plugs in the contact holes and the first metal layer, without using any other metal layer above the first metal layer.

Since the first wiring FL1 is laid out to overlap with the second gate wiring GL2 and the second wiring FL2 is laid out to overlap with the first gate wiring GL1, there is no need to increase the layout area of the first inverter IV1 and the second inverter IV2 significantly in order to layout the first wiring FL1 and the second wiring FL2. As a result, the area of the memory cell 1A can be minimized. Especially, a length W of the memory cell 1A in the Y direction as shown in FIG. 4 can be minimized.

Furthermore, even when the width of the first gate wiring GL 1 and the width of the second gate wiring GL2 are increased in order to suppress the leakage current between the source and the drain of each of the P channel transistors T1 and T3 and the N channel transistors T2 and T4, the first wiring FL1 and the second wiring FL2 are laid out efficiently using spaces above the firsts gate wiring GL1 and the second gate wiring GL2 where usually no wiring is laid out. Thus, the increase in the area of the memory cell can be minimized.

In addition to the first wiring FL1 and the second wiring FL2, conductors sm1, sm3, sm2, sm4, sm5 and sm6 are laid out as the first metal layer. Each of the conductors sm1, sm3, sm2, sm4, sm5 and sm6 is electrically connected to each of the sources S of the P channel transistors T1 and T3, the N channel transistors T2 and T4 and the transfer gates T6 and T5, respectively. Each of the conductors sm1, sm3, sm2, sm4, sm5 and sm6 is connected with each of plugs ps1, ps3, ps2, ps4, ps5 and ps6 formed in a contact hole penetrating through the insulation film (not shown) on each of the sources S, respectively.

Figure 5:
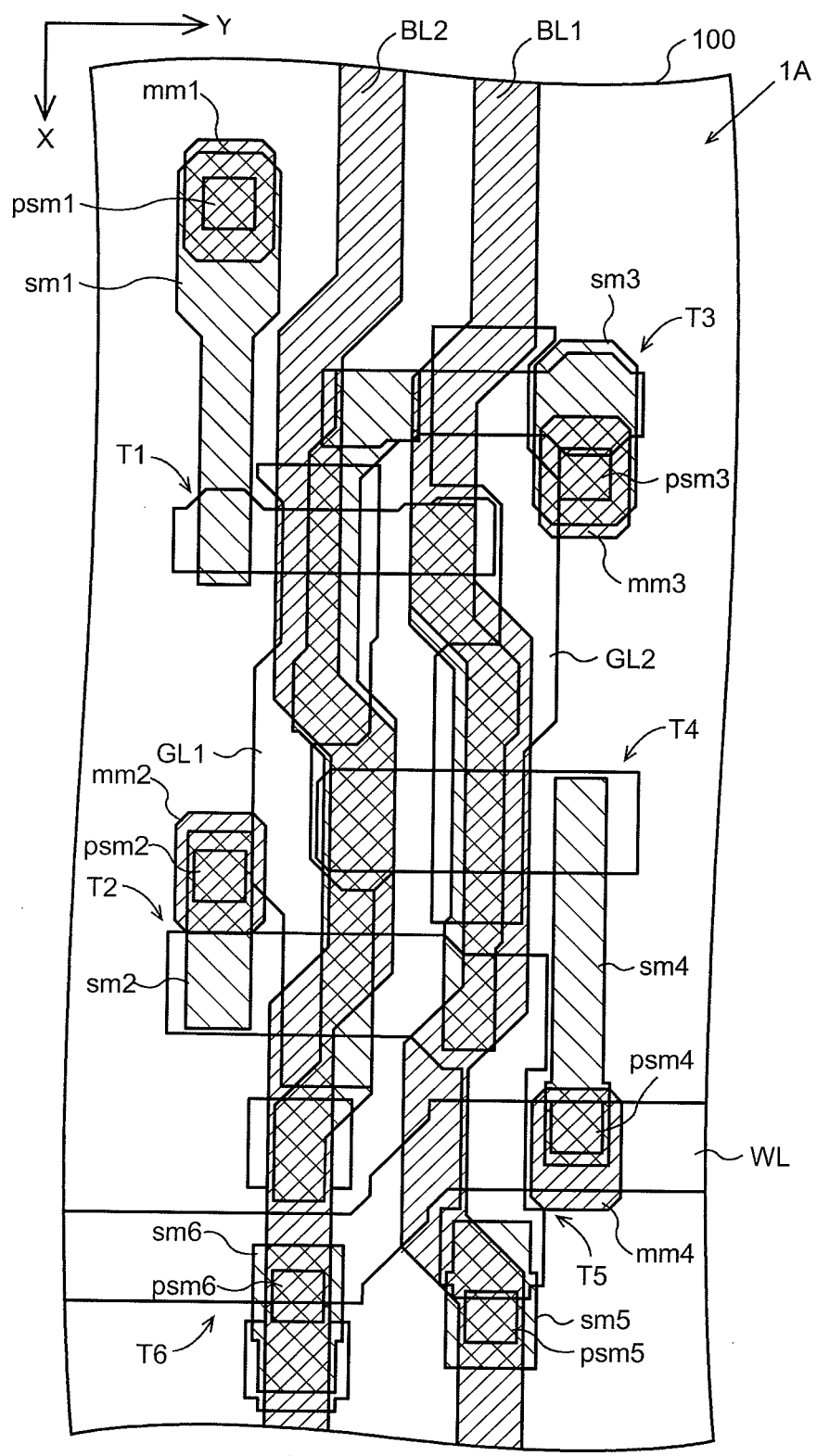
FIG. 5 is a plan view showing a layout of the memory cell of the SRAM shown in FIG. 1.

A layout of a second metal layer that is an upper layer of the first metal layer is hereafter explained. FIG. 5 shows the layout of the second metal layer disposed on an insulation film (not shown) that covers the first wiring FL1 and the second wiring FL2. The second metal layer is made of aluminum or alloy including aluminum, for example. The second metal layer is shown shaded with solid diagonal lines in FIG. 5.

Two third wirings BL1 and BL2 are laid out in the second metal layer as bit lines that are electrically connected with the sources S of the transfer gates T5 and T6. The third wiring BL1 is electrically connected with the source S of the transfer gate T5, while the other third wiring BL2 laid out adjacent the third wiring BL1 is electrically connected with the source S of the transfer gate T6. Each of the third wirings BL1 and BL2 is connected with each of the plugs psm5 and psm6 formed in a contact hole penetrating through the insulation film (not shown) on each of the conductors sm5 and sm6 of the first metal layer, respectively. A center line of each of the third wirings BL1 and BL2 extends approximately along the X direction as shown in FIG. 5.

In addition to the third wirings BL1 and BL2, conductors mm1, mm2, mm3 and mm4 are laid out as the second metal layer. Each of the conductors mm1, mm2, mm3 and mm4 is electrically connected with each of the conductors sm1, sm2, sm3 and sm4 of the first metal layer through each of the plugs psm1, psm2, psm3 and psm4 formed in a contact hole penetrating through the insulation film (not shown), respectively.

Furthermore, an insulation film (not shown) is disposed to cover the second metal layer, and a third metal layer that is an uppermost metal layer is disposed on the insulation film. The third metal layer is made of aluminum or alloy including aluminum, for example. In some cases, flexibility in wiring patterns of the third metal layer is severely restricted, depending on design rules adopted.

It is assumed in this embodiment that the third metal layer is thicker than the underlying first metal layer and the second metal layer in such a way that the third metal layer is formed to be about 0.7 μm-0.8 μm thick while the first metal layer and the second metal layer are about 0.5 μm-0.6 μm thick, for example, and is restricted by the design rules so that the third metal layer is laid out only in coarser and larger patterns than the first metal layer of the second metal layer. In other words, it is assumed that wiring patterns as fine as the first wiring FL1, the second wiring FL2 and the third wirings BL1 and BL2 are not allowed with the third metal layer. The restriction is common to the design rules which assume that thick external connection electrodes such as bonding pads are implemented with the third metal layer, for example.

Because of the restriction by the design rules as described above, the third wirings BL1 and BL2 that are the bit lines are laid out using the second metal layer with which fine patterning is allowed.

Figure 6:
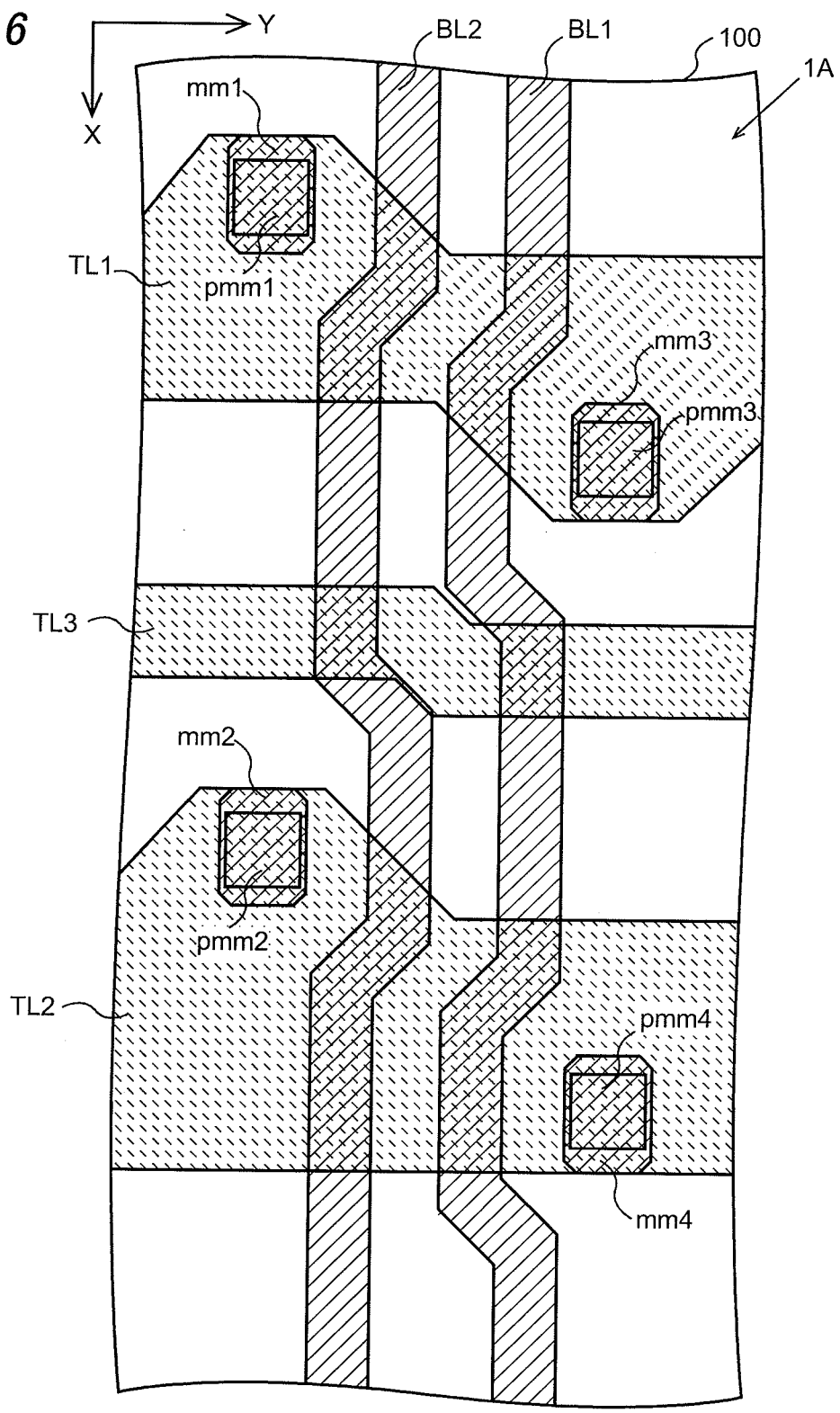
FIG. 6 is a plan view showing a layout of the memory cell of the SRAM shown in FIG. 1.

A layout of the third metal layer is hereafter explained. FIG. 6 shows the layout of the third metal layer disposed on the insulation film (not shown) that covers the third wirings BL1 and BL2 made of the second metal layer. The third metal layer is shown shaded with dashed diagonal lines in FIG. 6.

Because of the restriction by the design rules described above, a fourth wiring TL1, a fifth wiring TL2 and a sixth wiring TL3 are laid out with the third metal layer in coarser and larger wiring patterns than with the first and second metal layers. The fourth wiring TL1 is a power supply line to which a power supply electric potential Vcc is applied, and is connected with the source S of each of the P channel transistors T1 and T3 in the first and second inverters IV1 and IV2. The fifth wiring TL2 is a ground line to which a ground electric potential is applied, and is connected with the source S of each of the N channel transistors T2 and T4 in the first and second inverters IV1 and IV2.

The fourth wiring TL1 is connected with each of plugs pmm1 and pmm3 formed in a contact hole penetrating through the insulation film (not shown) on each of the conductors mm1 and mm3, respectively. The fifth wiring TL2 is connected with each of plugs pmm2 and pmm4 formed in a contact hole penetrating through the insulation film (not shown) on each of the conductors mm2 and mm4, respectively. The sixth wiring TL3 is electrically connected with the word line WL in a region not shown in FIG. 6 in order to reduce electrical resistance of the word line WL that is made of polysilicon.

Center lines of the fourth, fifth and sixth wirings TL1, TL2 and TL3 extend approximately along a direction perpendicular to the direction of extension of the first gate wiring GL1 and the second gate wiring GL2, that is, along the Y direction as shown in FIG. 6.

A plurality of the memory cells 1A composed of the multilayer structure of the layout as described above referring to FIG. 3 through FIG. 6 is arrayed at regular intervals in the X direction and in the Y direction to form a regular pattern. Corresponding to the regular pattern, the memory cells 1A adjacent to each other may be mirror-symmetrical to each other, or may be slightly modified to accommodate a portion shared by the adjacent memory cells 1A.

With the layout of the memory cell 1A described above, electrical connection between the two drains D included in each of the first and second inverters IV1 and IV2 and the loop connection of the first inverter IV1 and the second inverter IV2 are implemented with the first metal layer (the first wiring FL1 and the second wiring FL2) even in the case in which the flexibility in the wiring pattern is severely restricted by the design rules. Also, even when the width of the first gate wiring GL1 and the width of the second gate wiring GL2 are required to increase in order to suppress the leakage current between the source and the drain of each of the transistors, the first metal layer (the first wiring FL1 and the second wiring FL2) is laid out efficiently utilizing the space above the gate wirings GL1 and GL2. As a result, the area of the memory cell 1A can be minimized.

Particularly in the memory-embedded semiconductor device in which the flash memory 2 and the microcomputer 3 are disposed on the semiconductor substrate 100 in addition to the SRAM 1 that is composed of the plurality of memory cells 1A, the increase in the area of the memory cell 1A of the SRAM 1 makes a factor to increase the size of the semiconductor device. Since the layout of the memory cell 1A of the SRAM 1 can be minimized with the semiconductor device according to the embodiment of this invention, the increase in the size of the memory-embedded semiconductor device can be minimized.

It is apparent that this invention is not limited to the embodiment described above, and may be modified within the scope of the invention.

For example, although the SRAM 1, the flash memory 2 and the microcomputer 3 are disposed on the semiconductor substrate 100 in the embodiment described above, this invention is not limited to the above. For example, this invention may be applied to the case where the flash memory 2 or the microcomputer 3 is, or both the flash memory 2 and the microcomputer 3 are, not disposed on the semiconductor substrate 100. Also, this invention may be applied to the case where a device other than the flash memory 2 or the microcomputer 3 is disposed on the semiconductor substrate 100 as long as the SRAM 1 described above is disposed.

With the semiconductor device according to the embodiment of this invention, the increase in the area of the memory cell can be minimized even when there is the restriction on the gate wiring due to the leakage current between the source and the drain of the CMOS inverter or the restriction due to the design rules on the metal layer.

What is claimed is:

1. A memory cell configured to operate as part of a semiconductor device, the memory comprising:
   a first CMOS inverter comprising a first transistor of a P channel and a second transistor of an N channel;
   a second CMOS inverter comprising a third transistor of a P channel and a fourth transistor of an N channel;
   a first gate wiring connecting a gate of the first transistor and a gate of the second transistor;
   a second gate wiring connecting a gate of the third transistor and a gate of the fourth transistor;
   a first metal layer disposed on the first and second gate wirings and comprising a first wiring portion and a second wiring portion, the first wiring portion being connected to a drain of the first transistor, a drain of the second transistor and the second gate wiring, the second wiring portion being connected to a drain of the third transistor, a drain of the fourth transistor and the first gate wiring, the first wiring portion overlapping the second gate wiring at least partially, and the second wiring portion overlapping the first gate wiring at least partially;
   a second metal layer disposed on the first metal layer; and
   a third metal layer disposed on the second metal layer,
   wherein the first transistor and the second transistor do not overlap in plan view of the memory cell, and the third transistor and the fourth transistor do not overlap in the plan view.

2. The semiconductor device of claim 1, wherein the first wiring portion, the second gate wiring and the gate of the fourth transistor overlap, the second wiring portion, the first gate wiring and the gate of the first transistor overlap, and the second wiring portion, the first gate wiring and the gate of the second transistor also overlap.

3. The semiconductor device of claim 2, wherein a width of the first wiring portion is equal to or smaller than a width of the second gate wiring at the gate of the fourth transistor, and a width of the second wiring portion is equal to or smaller than a width of the first gate wiring at the gates of the first and second transistors.

4. The semiconductor device of claim 1, further comprising a first bit line, a second bit line, a first transfer gate and a second transfer gate, wherein the first bit line and the second bit line are part of the second metal layer, the first transfer gate is connected to the first bit line and the first CMOS inverter, and the second transfer gate is connected to the second bit line and the second CMOS inverter.

5. The semiconductor device of claim 1, further comprising a power supply line and a ground line, wherein the power supply line and the ground line are part of the third metal layer.

6. The semiconductor device of claim 1, further comprising a microcomputer that controls the memory cell, the memory cell and the microcomputer being disposed on a single substrate.

7. The semiconductor device of claim 6, further comprising a flash memory, the flash memory being disposed on the single substrate and being controlled by the microcomputer.

* * * * *